(12) United States Patent
Bayan et al.

(10) Patent No.: US 7,836,586 B2
(45) Date of Patent: Nov. 23, 2010

(54) THIN FOIL SEMICONDUCTOR PACKAGE

(75) Inventors: Jaime A. Bayan, San Francisco, CA (US); Nghia Thuc Tu, San Jose, CA (US); Will Kiang Wong, Daly City, CA (US); David Chin, Cupertino, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 218 days.

(21) Appl. No.: 12/195,704

(22) Filed: Aug. 21, 2008

(65) Prior Publication Data

US 2010/0046188 A1 Feb. 25, 2010

(51) Int. Cl.
H05K 3/30 (2006.01)
H01L 21/00 (2006.01)

(52) U.S. Cl. .......................... 29/841; 438/106; 438/127

(58) Field of Classification Search ........... 29/831–832, 29/841–842, 848, 855, 858; 174/521, 527, 174/531; 438/106, 110, 127; 257/177–178, 257/276, 584, 688–690, 734; 264/272.13, 264/272.17
See application file for complete search history.

(56) References Cited

U.S. PATENT DOCUMENTS

| | | | | |
|---|---|---|---|---|
| 5,308,797 | A * | 5/1994 | Kee | 438/127 |
| 6,268,648 | B1 * | 7/2001 | Fukutomi et al. | 257/678 |
| 6,518,161 | B1 * | 2/2003 | Rajagopalan et al. | 438/612 |
| 6,534,849 | B1 * | 3/2003 | Gang | 257/678 |
| 2004/0127011 | A1 * | 7/2004 | Huang et al. | 438/613 |
| 2007/0176303 | A1 * | 8/2007 | Murai et al. | 257/787 |

FOREIGN PATENT DOCUMENTS

| | | |
|---|---|---|
| JP | 09-252014 | * 9/1997 |
| JP | 09-252014 A | 9/1997 |
| JP | 2000-252389 | 9/2000 |
| JP | 2001-127212 | 5/2001 |
| JP | 2004-058578 A | 2/2004 |

OTHER PUBLICATIONS

U.S. Appl. No. 12/133,335, filed Jun. 4, 2008.
FlipChip International, "Bump on I/O Process," downloaded on Nov. 1, 2007 from http://www.flipchip.com/services/wafer_level/ultra_csp/bump_process.shtml.

(Continued)

Primary Examiner—A. Dexter Tugbang
Assistant Examiner—David P Angwin
(74) Attorney, Agent, or Firm—Beyer Law Group LLP

(57) ABSTRACT

The present invention relates to methods and arrangements for using a thin foil to form electrical interconnects in an integrated circuit package. One such arrangement involves a foil carrier structure, which includes a foil adhered to a carrier having cavities. Some methods of the present invention involve attaching dice to the foil and encapsulating the foil carrier structure in a molding material. In one embodiment, the molding material presses against the foil, which causes portions of the foil to distend into the cavities of the carrier. As a result, recessed and raised areas are formed in the foil. Afterwards, the carrier is removed and portions of the raised areas in the foil are removed through one of a variety of techniques, such as grinding. This process helps define and electrical isolate contact pads in the foil. The resulting molded foil structure may then be singulated into multiple semiconductor packages.

11 Claims, 5 Drawing Sheets

OTHER PUBLICATIONS

FlipChip International, "Redistributed Process," downloaded on Nov. 1, 2007 from http://www.flipchip.com/services/wafer_level_ultra_csp/redistributed_process.shtml.
U.S. Appl. No. 12/633,703, filed Dec. 8, 2009.
U.S. Appl. No. 12/571,202, filed Sep. 30, 2009.
Search Report dated Jan. 13, 2010 from International Application No. PCT/US2009/046000.
Written Opinion dated Jan. 13, 2010 in from International Application No. PCT/US2009/046000.
International Search Report dated Dec. 23, 2009 from International Application No. PCT/US2009/043503.
Written Opinion dated Dec. 23, 2009 from International Application No. PCT/US2009/043503.
U.S. Appl. No. 12/571,223, filed Sep. 30, 2009.

* cited by examiner

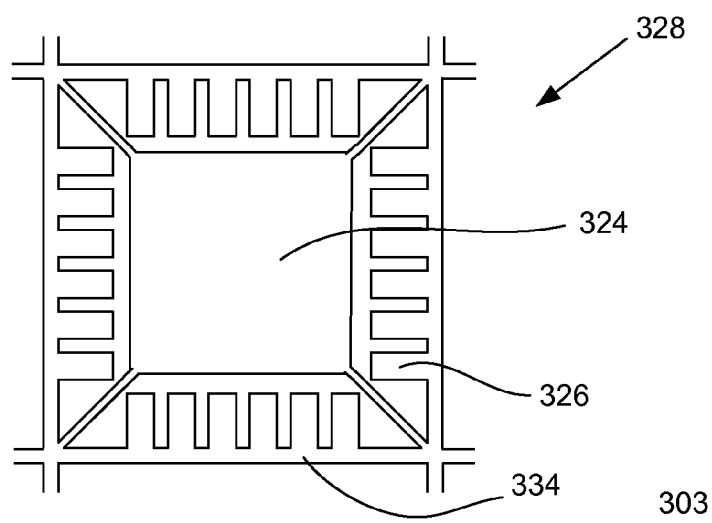
FIG. 3F
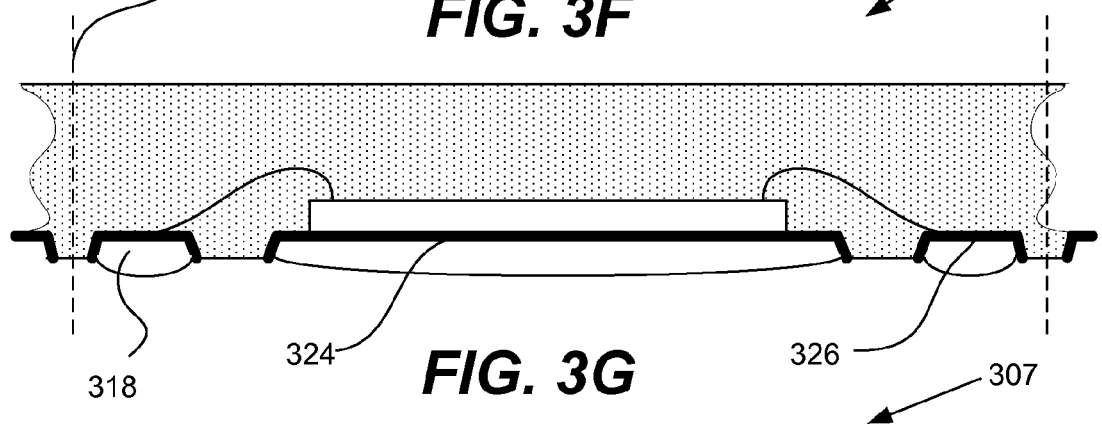
FIG. 3G
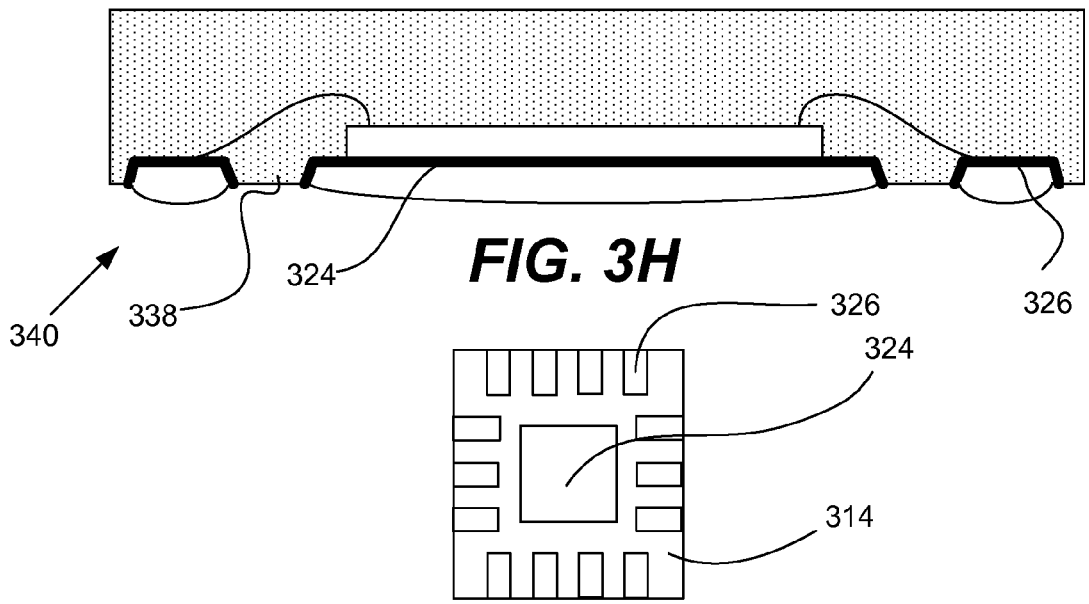
FIG. 3H
FIG. 3I

THIN FOIL SEMICONDUCTOR PACKAGE

FIELD OF THE INVENTION

The present invention relates generally to the packaging of integrated circuits (ICs). More particularly, the invention relates to packaging methods and arrangements involving thin foils.

BACKGROUND OF THE INVENTION

There are a number of conventional processes for packaging integrated circuit (IC) dice. By way of example, many IC packages utilize a metallic leadframe that has been stamped or etched from a metal sheet to provide electrical interconnects to external devices. The die may be electrically connected to the leadframe by means of bonding wires, solder bumps or other suitable electrical connections. In general, the die and portions of the leadframe are encapsulated with a molding material to protect the delicate electrical components on the active side of the die while leaving selected portions of the leadframe exposed to facilitate electrical connections to external devices.

Many conventional leadframes have a thickness of approximately 4-8 mils. Further reducing the thickness of the leadframe offers several benefits, including the potential of reducing the overall package size and conserving leadframe metal. In general, however, a thinner leadframe has a greater propensity to warp during the packaging process. A supporting structure, such as backing tape, may be applied to the leadframe to reduce the risk of warpage. Such structures, however, may entail higher costs.

At various times, package designs have been proposed that utilize a metal foil as the electrical interconnect structure in place of the leadframe. Although a number of foil based designs have been developed, none have achieved widespread acceptance in the industry in part because foil based packaging processes tend to be more expensive than conventional leadframe packaging and in part because much of the existing packaging equipment is not well suited for use with such foil based package designs.

Although existing techniques for fabricating leadframes and for packaging integrated circuits using leadframe technology work well, there are continuing efforts to develop even more efficient designs and methods for packaging integrated circuits.

SUMMARY OF THE INVENTION

The present invention relates to methods and arrangements for using a thin foil to form electrical interconnects in an integrated circuit package. One such arrangement involves a foil carrier structure, which includes a foil adhered to a carrier having cavities. The cavities on the carrier define various pedestals, which help support the foil. The pedestals form device area patterns that define an interconnect pattern for a semiconductor package.

Some methods of the present invention use the above foil carrier structure to manufacture integrated circuit packages. In one such method, integrated circuit dice are attached and wirebonded to the foil on the foil carrier structure. The foil carrier structure is then encapsulated with molding material. The molding material presses against the foil, such that the shape of the foil follows some of the contours of the underlying cavities on the carrier. As a result, raised and recessed areas are formed in the foil. Some of the recessed areas resemble interconnect components such as contact pads and/or die attach pads. The raised areas form bumps in the foil. Afterwards, the carrier is removed from the molded foil carrier structure, thus exposing the reshaped foil. At least a portion of the bumps in the foil are removed using any of a range of suitable techniques, including grinding. This process exposes portions of the molding material and isolates some of the recessed areas to define electrical contact pads in the foil. The resulting molded foil carrier structure is then singulated into multiple integrated circuit packages.

The above method has several benefits over existing techniques. By using a thin foil, the method conserves metal. Backing tape is not needed to support the foil. Additionally, photolithographic techniques are not required, since the contact pads may be isolated through other techniques, such as grinding.

In an alternative embodiment, the mold, rather than the carrier, has device area patterns for reshaping the foil. In this embodiment, a carrier is attached to a foil to form a foil carrier structure. The carrier has perforations and helps support the foil. After dice have been attached to the foil, the foil carrier structure is placed in a mold. Molding material flows through the perforations in the carrier and presses against the foil. The foil in turn is pressed against the device area patterns on the carrier. As a result, recessed and raised areas are formed in the foil. Afterwards, the carrier may optionally be removed. In this method, the subsequent removal of portions of the raised areas in the foil, the formation of contact pads and singulation take place in a manner similar to the techniques described above. Other foil carrier structures and molds suitable for performing the above operations are also described.

BRIEF DESCRIPTION OF THE DRAWINGS

The invention and the advantages thereof, may best be understood by reference to the following description taken in conjunction with the accompanying drawings in which:

FIGS. 3A-3I diagrammatically illustrates steps in the process flow diagram of FIG. 2.

In the drawings, like reference numerals are sometimes used to designate like structural elements. It should also be appreciated that the depictions in the figures are diagrammatic and not to scale.

DETAILED DESCRIPTION OF THE PREFERRED EMBODIMENTS

The present invention relates generally to the packaging of integrated circuits. More particularly, the invention relates to improved, low-cost methods and arrangements for using a thin foil to form electrical interconnects in an integrated circuit package.

Thin foils present semiconductor manufacturers with several challenges. As noted earlier, thin foil has a greater tendency to warp under the stresses of the packaging process. Additionally, existing packaging equipment, which is configured for handling leadframes, are ill suited for processing thin foils, since thin foils differ in size and are more fragile than leadframes.

In a prior application entitled "Foil Based Semiconductor Package," Wong et al., patent application Ser. No. 12/133, 335, the inventors proposed a novel carrier-based, low-cost mechanism for thin foil packaging that addresses these challenges. The various embodiments of the present invention, which are described below, also relate to thin foil packaging.

Figure 1A:
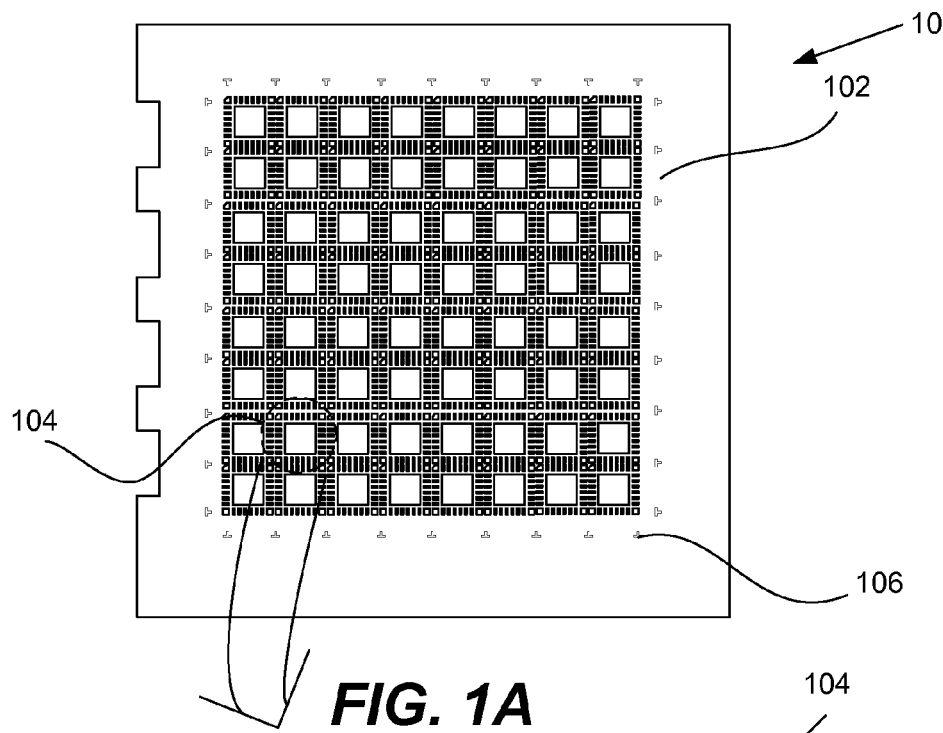
FIG. 1A is a diagrammatic top view of a foil carrier structure having multiple device area patterns according to one embodiment of the present invention.
Figure 1B:
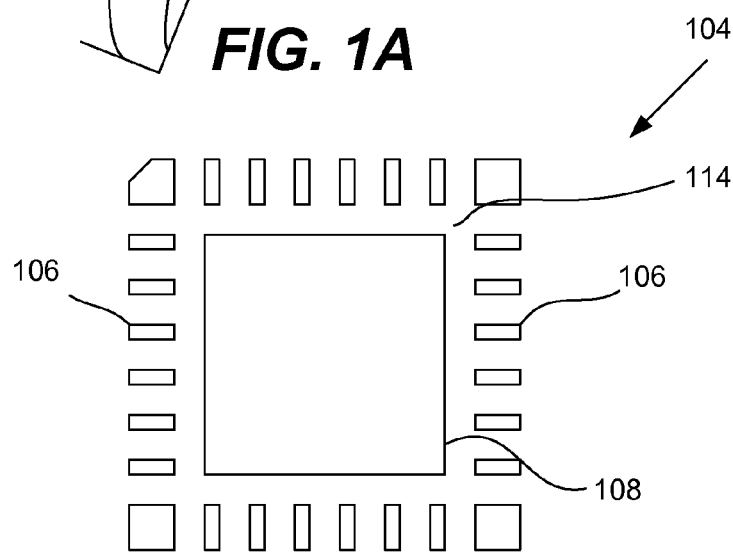
FIG. 1B is an enlarged top view of one of the device area patterns illustrated in FIG. 1A.
Figure 1C:
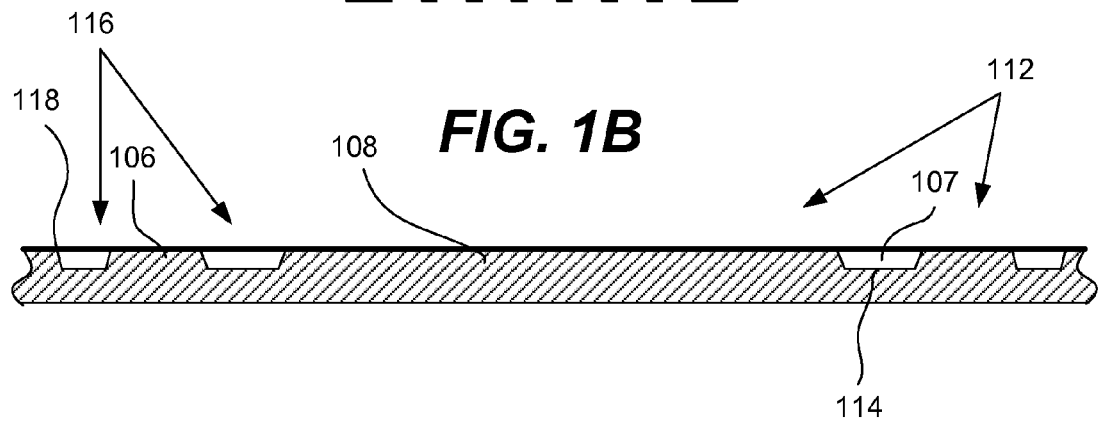
FIG. 1C is a diagrammatic side view of the foil carrier structure of FIG. 1A according to one embodiment of the present invention.

Referring initially to FIGS. 1A-1C, an embodiment of the present invention will be described. This embodiment involves a specially configured foil carrier structure. The foil carrier structure includes a thin metal foil adhered to a carrier. In the illustrated embodiment, the embossed carrier is used to form a desired metallization pattern in the foil. The pattern may include die attach pads, contact pads and/or any other desired metallization structures.

FIG. 1A is a diagrammatic top view of foil carrier structure 100 including a foil (not shown) adhered to carrier 102. In the illustrated embodiment, carrier 102 is embossed with device area patterns 104 and has fiducials 106 arranged along its periphery. Carrier 102 may be formed from a wide variety of materials, including aluminum, steel, copper, other metals, polyimide, plastics, ceramics and/or epoxy. The foil carrier structure may have different dimensions, depending on the needs of a particular application. When desirable, the foil carrier structure may take the form of a strip sized similiar to a conventional leadframe strip or panel.

FIG. 1B is an enlarged top view of device area pattern 104, which includes lead-related pedestals 106 and die-related pedestal 108. These structures extend from web 114. It should be noted that FIG. 1B is only one of many possible arrangements.

FIG. 1C is a side view of the device area pattern illustrated in FIG. 1B. FIG. 1C presents cavities 116, which define one or more webs 114 and pedestals 112. Pedestals 112 include die-related pedestal 108 and lead-related pedestal 106. Foil 118 is supported by the top surfaces of pedestals 112 such that gap 107 is formed around the various pedestals. Gap 107 is bounded at least by the foil and portions of one or more cavities. Some embodiments of the present invention contemplate a molding operation in which molding material presses against the foil. The foil in turn is pressed against at least some of the cavities of the carrier to form recessed and raised areas in the foil. Afterward, the raised areas may be removed through techniques such as grinding. The remaining portions of the foil define device areas suitable for attachment to integrated circuit dice. Such operations will be described below in FIGS. 2 and 3A-3I.

Figure 2:
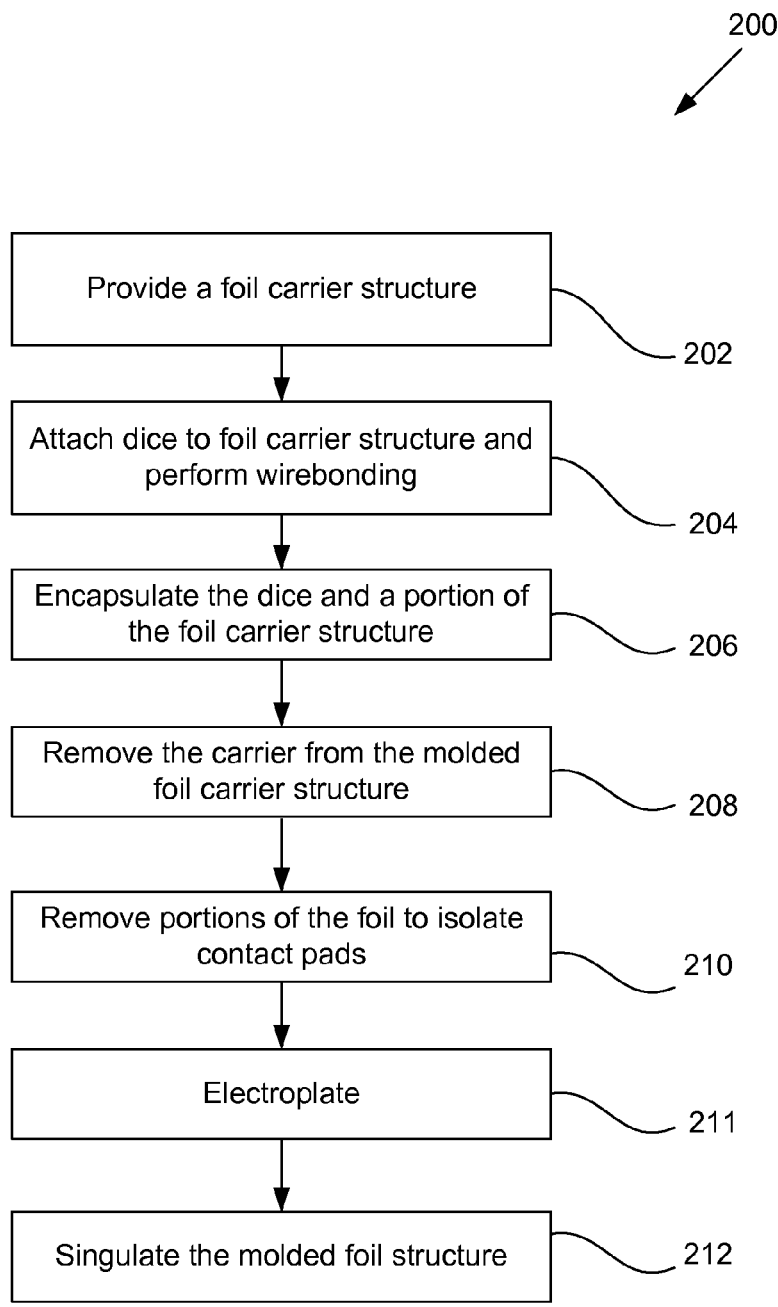
FIG. 2 is a process flow diagram for incorporating foil into the packaging of an integrated circuit device according to one embodiment of the present invention.
Figure 3A:
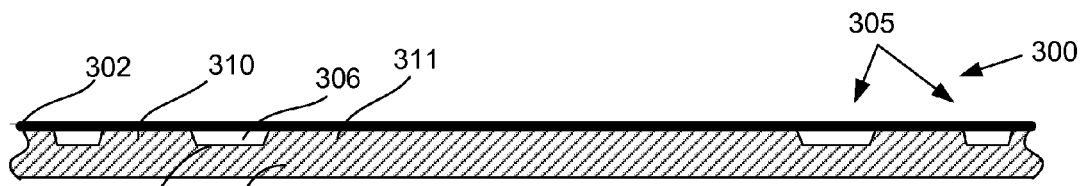

FIGS. 2 and 3A-3I illustrate a process 200 for packaging an integrated circuit device in accordance with one embodiment of the invention. Initially, in step 202, foil carrier structure 300 of FIG. 3A, which includes foil 302 and carrier 304, is provided. Foil carrier structure 300 includes cavities 305, web 312, lead-related pedestal 310, and die-related pedestal 311. FIG. 3A shows only a small portion of a larger foil carrier structure. Foil carrier structure 300 may take the form of foil carrier structure 100 of FIG. 1A, although this is not required. In the illustrated embodiment, foil 302 is a copper foil and carrier 304 is formed from steel. In alternative embodiments, different metal foils may be used in place of the copper foil and different carrier structures may be used in place of the steel carrier. For example, the carrier may alternatively be made of copper, steel, aluminum, plastic, ceramic, other metals, non-conductive materials such as polyimide or a wide variety of other suitable materials. In some embodiments, carrier 304 is perforated. (An example of packaging operations involving such a carrier are described later in connection with FIGS. 4A-4D.)

The dimensions of the foil carrier structure 300 may be widely varied to meet the needs of a particular application. In some embodiments, the foil carrier structure 300 is approximately the size of a typical leadframe strip. The thicknesses of the foil 302 and carrier 304 may also be widely varied. In some embodiments, the foil has a thickness in the range of approximately 0.6 to 2 mils. The carrier may have a thickness in the range of approximately 5 to 12 mils. Generally, it is advantageous to have the thickness of the foil carrier structure generally match that of a standard leadframe, so that standard packaging equipment adapted to handle leadframes may be used to process the structure.

Figure 3B:
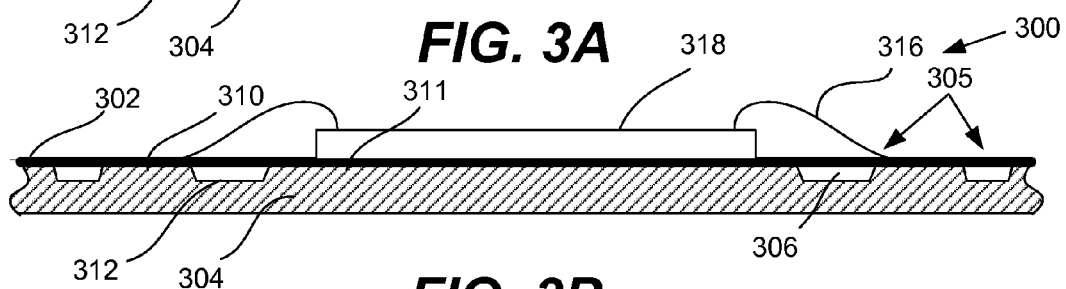

In step 204 of FIG. 2, dice 318 of FIG. 3B are mounted on foil carrier structure 300. In the illustrated embodiment, die 318 is positioned on die-related pedestal 311. After the dice have been attached, they are electrically connected to the foil by suitable means such as wire bonding. The wire bonded structure is illustrated in FIG. 3B. In some embodiments, such wire bonding and die attachment operations are performed "blind." That is, the only or primary reference points used in such operations are fiducials on portions of the carrier that are not covered by the foil. It should be appreciated that one of the significant advantages of the described approach is that commonly available die attach and wire bonding equipment may be used in the die attachment and wire bonding steps. The resultant structure has a plurality of dice that are electrically connected to the foil by bonding wires 316. In the illustrated embodiment, additional layers of nickel and palladium are provided on the top surface of foil 302. The upper palladium layer helps to anchor wires 316 more firmly in the foil.

Figure 3C:
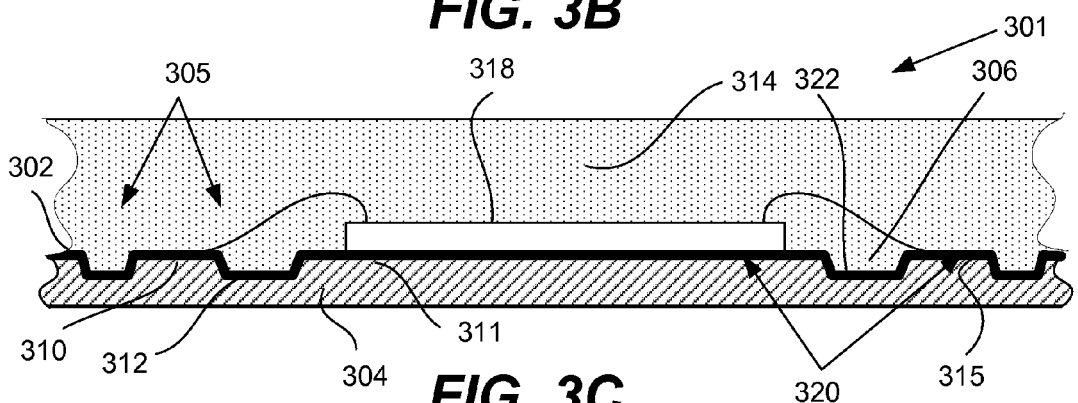

In step 206, dice 318, wires 316 and at least a portion of foil carrier structure 300 of FIG. 3B is encapsulated with a molding material 314 of FIG. 3C, forming molded foil carrier structure 301. The molding material presses against foil 302 and causes the foil to distend. As a result, molding material 314 fills a portion of gap 306 and extends below top surface 315 of carrier 304. Foil 302 in turn is pressed against cavities 305, web 312, die-related pedestal 311 and pedestals 310 of FIG. 3B. Because of this pressure, foil 302 is reshaped to follow contours of the cavities in the carrier. Accordingly, raised areas 322 and recessed areas 320 of FIG. 3C are formed in the foil. In the illustrated embodiment, recessed areas 320 define metallization structures, such as contact pads, die attach pads etc. Raised areas 322 form bumps that extend outward from the foil, making them easier to separate from the rest of the foil in later stages of the packaging process.

In an alternative embodiment, the carrier in the foil carrier structure has cavities similar to cavities 305 of FIG. 3C, except that they extend entirely through the carrier. In this embodiment, the foil carrier structure is placed in a mold cavity. The surface of the mold cavity rests against the bottom surface of the carrier and, together with the carrier, defines various recessed regions. As in the illustrated embodiment, molding material presses against the foil and pushes it into the recessed regions and against the surfaces of the carrier and the mold cavity. As a result, the foil is distended and reshaped into a desirable configuration. Some of the above types of carriers lack a web, but instead use other structures, such as tie bars, to support the pedestals on the carrier.

It is noted that molding material 314 in the illustrated embodiment of FIG. 3C is added in a single continuous strip. That is, the molding material has been relatively evenly applied across the molded portions of foil 302. This type of molding is not common in leadframe based packaging. Rather, the devices carried on leadframe strips are typically molded either individually or in sub-panels. The benefits of a continuous strip of molding material will be discussed in connection with FIGS. 3D, 3E and step 208.

Figure 3D:
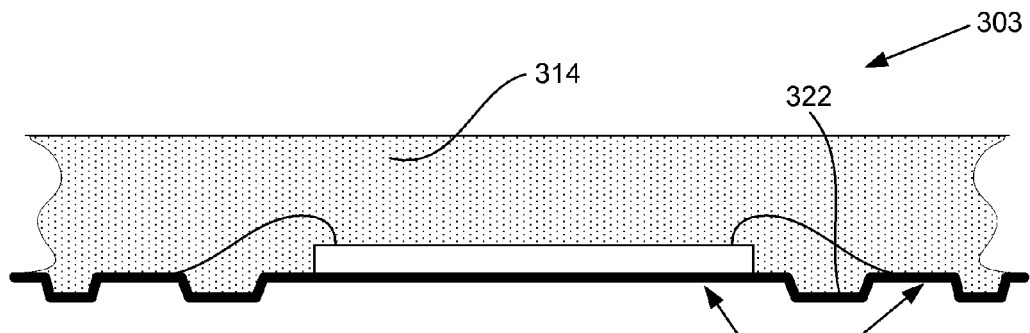

In step 208, the carrier portion of molded foil carrier structure 301 of FIG. 3C is removed, resulting in molded foil structure 303 of FIG. 3D. Carrier 304 of FIG. 3C is optionally reusable. At this point the molding material provides structural support for the foil in place of the carrier 304. It should be appreciated that an advantage of the continuous strip molding approach is that it provides good support for the entire panel so that the strip may still be handled in panel form. In contrast, if molding gaps are provided between subpanels during the molding operation, then the subpanels would need to be handled independently after removal of the carrier.

Figure 3E:
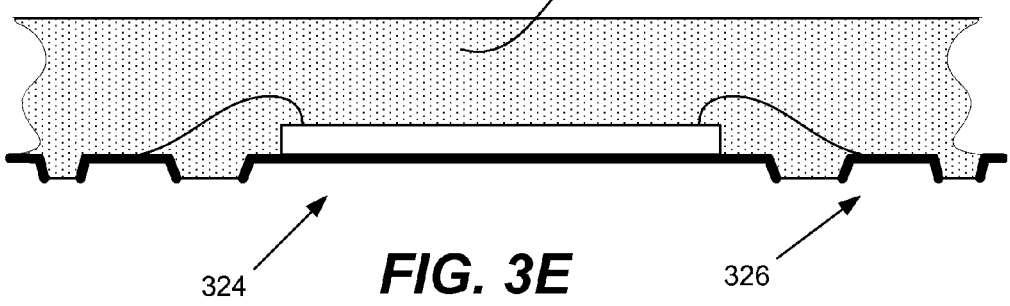

In FIG. 3E, portions of the raised areas of the foil are removed. The reshaping of the foil in FIG. 3C caused raised areas or bumps 322 of FIG. 3D to extend from the bottom of molded foil structure 303. These portions of the foil are more easily removed by grinding and other cutting techniques. Suitable techniques other than grinding, such as laser cutting and etching, may also be used. The raised and recessed areas of the foil of FIG. 3D are designed so that that the removal of the raised areas in FIG. 3E would at least partially isolate and define metallization structures such as die attach pad 324 and contact leads 326. In alternative embodiments, different portions of the foil may protrude from the bottom of molded foil structure 303 and be removed.

One advantage of a grinding or cutting technique is that it may be more cost-effective. Some thin foil packaging methods utilize photolithography to etch the foil. Photolithography typically requires the application of a photoresist layer and several other processing steps. The aforementioned techniques avoid the costs and delays associated with photolithography.

In some embodiments, the cutting or grinding operations form electroplating interconnects in the foil in order to facilitate the later electroplating of a metal, such as tin or solder. FIG. 3F diagrammatically illustrates a device area 328 with such interconnects. Device area 328, which is on the bottom of molded foil structure 303 of FIG. 3E, has a die attach pad 324, contact leads 326 and electroplating interconnects 334. Electroplating interconnects 334 electrically connect the pad and leads and typically extend across saw streets used during singulation. Electroplating interconnects 334 may also form conductive links between multiple device areas. It should be appreciated that device area 328 represents only one of many possible arrangements. By way of example, device area 328 may include ground bus bars and other suitable interconnect features.

As discussed above, some embodiments contemplate step 211 of FIG. 2, which involves the electroplating of solder 318 of FIG. 3G onto die attach pad 324 and contact leads 326. In step 212, the molded foil structure 303 is singulated along projected saw streets 336 of FIG. 3G to form individual semiconductor packages. Molded foil structure 303 may be singulated using a variety of techniques, including sawing and laser cutting. Singulation may remove electroplating interconnects 334 of FIG. 3F. Electroplating interconnects may also be removed using other suitable techniques such as selective cutting. An enlarged side view of singulated package 307 is illustrated in FIG. 3H. A diagrammatic bottom view of the package is shown in FIG. 3I. The bottom view illustrates die attach pad 324 and contact leads 326 surrounded by molding material 314.

It should be noted that the aforementioned operations sometimes add distinctive features to the bottom surface of particular packages and/or molded foil structures. By way of example, the illustrated embodiment of FIG. 3H shows bottom surface 340 of package 307 having protrusions 338 of molding material. Molding material is exposed on a portion of the protrusions. In some embodiments, the sides of the protrusions are covered with metallic foil and molding material is exposed on the bottom of the protrusions. The protrusions extend lower than the majority of the surface area of die attach pad 324 and contact leads 326. The bottom surface of package 307 may be arranged in other ways as well.

Figure 4A:
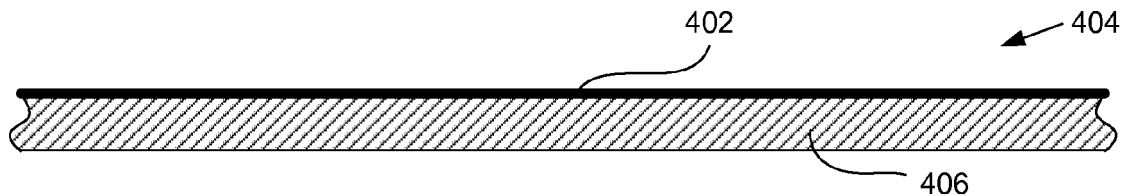
FIG. 4A is a diagrammatic top view of a foil carrier structure according to one alternative embodiment of the present invention.
Figure 4B:
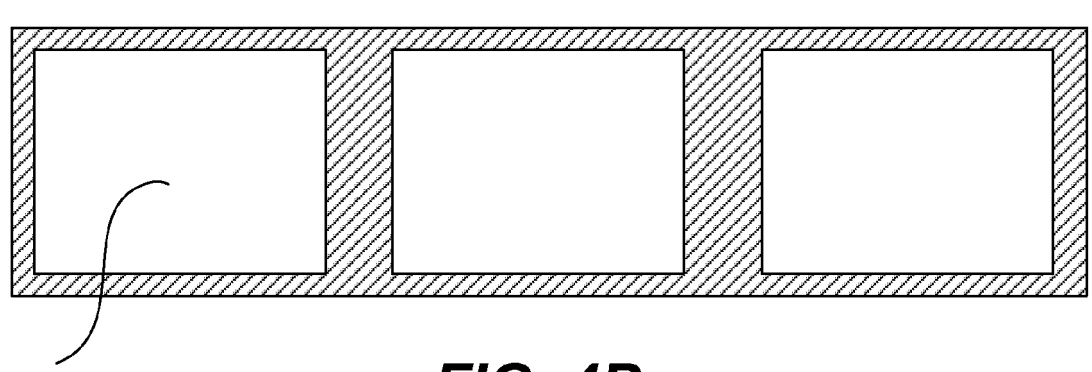
FIG. 4B is a diagrammatic top view of the carrier in the foil carrier structure illustrated in FIG. 4A.

Referring next to FIGS. 4A-4D, an alternative embodiment will be described. In this embodiment, the mold, rather than the carrier, has device area patterns whose negative image is embossed into the foil. FIG. 4A is a diagrammatic side view of foil carrier structure 404 having foil 402 adhered to carrier 406. As shown in FIG. 4B, which presents a top view of carrier 406, the carrier lacks cavities 305 of the foil carrier structure in FIG. 3A and has perforations 408. Foil carrier structure 404 may be processed using operations similar to those in FIG. 2. Die attachment and wirebonding, for example, may be performed on foil carrier structure 404.

Figure 4C:
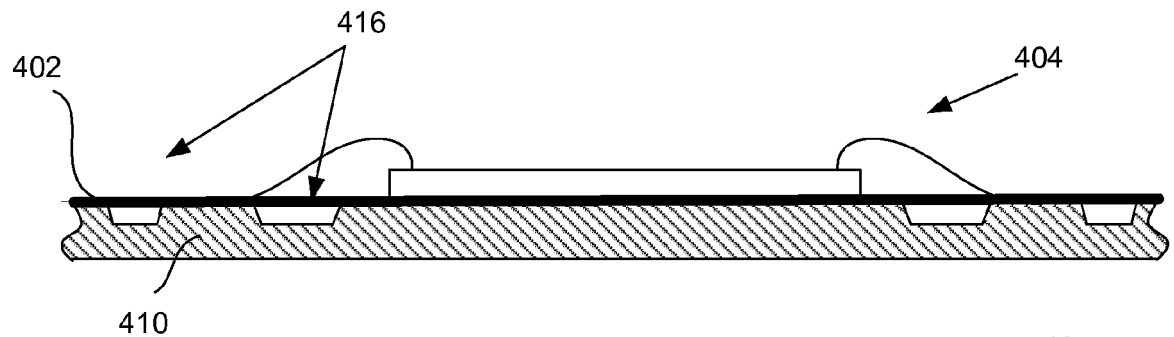
FIGS. 4C-4D illustrate steps in the packaging process involving the foil carrier structure illustrated in FIG. 4A.
Figure 4D:
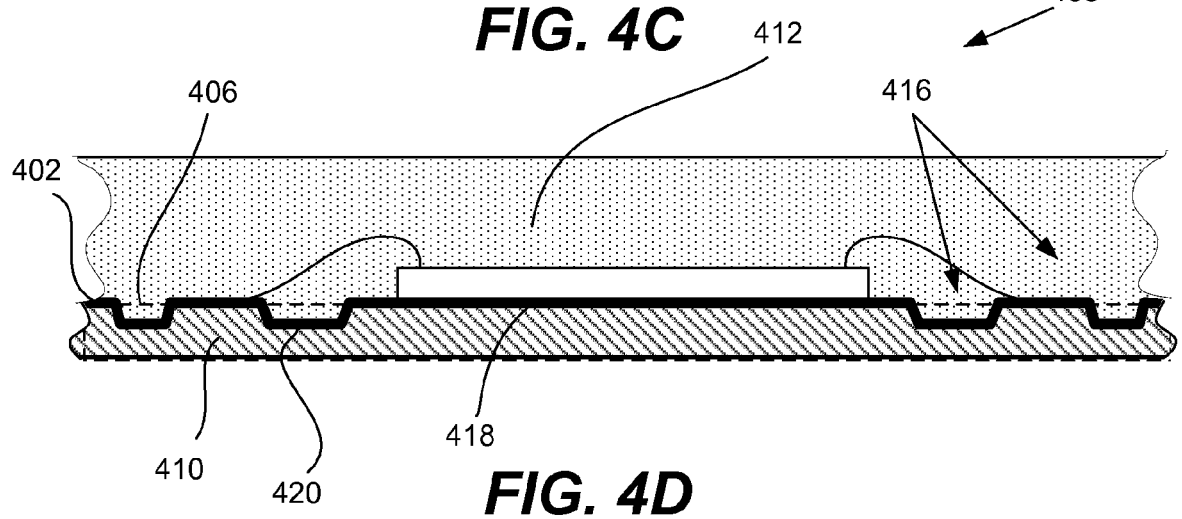

Some operations, however, are different from those illustrated in FIG. 2. Before the encapsulation process, the foil carrier structure 404 of FIG. 4C is positioned in a mold 410. Mold 410 has cavities 416 and, together with carrier 406 (not shown), supports foil 402. During the encapsulation process, molding material 412 passes through the perforations in carrier 406 and pushes against foil 402, as diagrammatically illustrated in FIG. 4D. As a result, portions of foil 402 is distended into the cavities. Accordingly, recessed areas 418 and raised areas 420 of FIG. 4D are formed in the foil. After such operations, carrier 406 may optionally be removed from molded foil carrier structure 405. Similar to corresponding steps in FIG. 2, portions of the raised areas of the foil are then removed, device areas are formed from the remaining recessed areas of the foil, and the resulting structure may be singulated to form multiple integrated circuit packages.

Although only a few embodiments of the invention have been described in detail, it should be appreciated that the invention may be implemented in many other forms without departing from the spirit or scope of the invention. In the foregoing description, many of the described leadframe-like structures (e.g. foils) include leads and/or contacts, which are frequently referred to herein as contact leads. In the context of this invention, the term contact lead is intended to encompass leads, contacts and other electrical interconnect structures that may be present within a leadframe-like structure. Therefore, the present embodiments should be considered as illustrative and not restrictive and the invention is not limited to the details given herein, but may be modified within the scope and equivalents of the appended claims.

What is claimed is:

1. A method for packaging integrated circuit devices, comprising:
   providing a foil carrier structure including a metallic foil adhered to a carrier;
   attaching a multiplicity of dice to the metallic foil;
   encapsulating portions of the multiplicity of dice and the metallic foil with a molding material to form a molded foil carrier structure, wherein the encapsulating step forms raised and recessed areas in the metallic foil, the recessed areas defining at least one device area, each device area adapted to electrically connect with an integrated circuit die;

removing at least a portion of the raised areas of the metallic foil, thereby exposing a portion of the molding material and isolating a plurality of electrical contact pads for each device area.

2. The method of claim 1, comprising singulating the molded foil carrier structure to form a multiplicity of packaged integrated circuit devices.

3. The method of claim 1, further comprising removing the carrier from the molded foil carrier structure after the encapsulating and before the removing operation.

4. The method of claim 1, wherein the carrier includes cavities defining a plurality of pedestals that define at least one device area pattern wherein the pedestals define the recessed areas in the encapsulated foil and the cavities define the raised areas in the metallic foil.

5. The method of claim 4, wherein during the encapsulating step the molding material pushes the foil against the carrier thereby distending portions of the foil into the cavities so as to reshape the metallic foil and form the raised and recessed areas of the metallic foil.

6. The method of claim 1, further comprising positioning, prior to the encapsulating step, the foil structure on a mold and wherein the carrier includes perforations and wherein the encapsulating step includes depositing molding material through the perforations and into cavities of the mold such that the molding material pushes the metallic foil against the mold thereby distending portions of the foil into the cavities so as to reshape the metallic foil and form the raised and recessed areas in the metallic foil.

7. The method of claim 1, wherein the removing of at least a portion of the raised areas of the metallic foil involves grinding.

8. The method of claim 1, wherein the carrier includes fiducials arranged along the periphery of the carrier and wherein the method further comprises:

determining, using the fiducials as reference points, wire bonding sites on the foil; and attaching, based on the determining step, wires connecting the multiplicity of dice with the wire bonding sites.

9. The method of claim 5, further comprising:

removing the carrier from the molded foil carrier structure after the encapsulating of the dice and foil and before the removing of at least a portion of the raised foil; and singulating the molded foil carrier structure to form a multiplicity of packaged integrated circuit devices.

10. The method of claim 5, further comprising positioning, prior to the encapsulating step, the foil structure on a mold and wherein the carrier includes perforations and wherein the encapsulating step includes depositing molding material through the perforations and into cavities of the mold such that the molding material pushes the metallic foil against the mold thereby distending portions of the foil into the cavities so as to reshape the metallic foil and form the raised and recessed areas in the metallic foil.

11. The method of claim 5, wherein the carrier includes fiducials arranged along the periphery of the carrier and wherein the method further comprises:

determining, using the fiducials as reference points, wire bonding sites on the foil; and attaching, based on the determining step, wires connecting the multiplicity of dice with the wire bonding sites.

\* \* \* \* \*